US006011291A

United States Patent [19]

Russell et al.

[11] Patent Number: 6,011,291

[45] **Date of Patent: *Jan. 4, 2000**

[54] VIDEO DISPLAY WITH INTEGRATED CONTROL CIRCUITRY FORMED ON A DIELECTRIC SUBSTRATE

[75] Inventors: Stephen D. Russell; Randy L. Shimabukuro, both of San Diego, Calif.

[73] Assignee: The United States of America as represented by the Secretary of the Navy, Washington, D.C.

[ * ] Notice: This patent issued on a continued prosecution application filed under 37 CFR 1.53(d), and is subject to the twenty year patent term provisions of 35 U.S.C. 154(a)(2).

[21] Appl. No.: 08/803,933

[22] Filed: Feb. 21, 1997

[51] Int. Cl.[7] .......................... H01L 27/01; H01J 23/16; H01J 1/02; H01J 9/00

[52] U.S. Cl. .......................... 257/347; 315/3; 313/309; 313/310; 445/24; 257/350

[58] Field of Search .......................... 257/59, 72, 347, 257/350, 352; 315/3.35, 169.1, 349, 169.3; 313/308, 309, 351, 310, 336, 525, 469; 445/24, 25, 50, 51; 345/77, 74

[56] References Cited

U.S. PATENT DOCUMENTS

| | | | |
|---|---|---|---|
| 4,114,095 | 9/1978 | Pankove et al. . | |
| 4,497,683 | 2/1985 | Celler et al. . | |
| 4,693,758 | 9/1987 | Kobayashi et al. | 257/352 |
| 4,983,878 | 1/1991 | Lee et al. | 313/308 |
| 5,110,748 | 5/1992 | Sarma . | |
| 5,153,483 | 10/1992 | Kishino et al. | 315/3 |
| 5,281,840 | 1/1994 | Sarma . | |
| 5,308,779 | 5/1994 | Sarma . | |
| 5,310,626 | 5/1994 | Fernandes et al. . | |
| 5,319,233 | 6/1994 | Kane | 257/350 |
| 5,742,267 | 4/1998 | Wilkinson | 345/77 |

OTHER PUBLICATIONS

U.S. application No. 08/105,252, Shimabukuro et al., filed Aug. 4, 1993.

U.S. application No. 08/301,170, Shimabukuro et al., filed Sep. 1, 1994.

U.S. applicaton No. 08/518,051, Russell et al., filed Aug. 22, 1995.

U.S. application No. 08/668,646, Shimabukuro et al., filed Jun. 13, 1996.

Shimabukuro et al., "Ultra–thin silicon on sapphire for high–density AMLCD drivers", *SPIE*, vol. 2174/85, 1994.

*Primary Examiner*—Steven H. Loke

*Attorney, Agent, or Firm*—Harvey Fendelman; Peter A. Lipovsky; Michael A. Kagan

[57] ABSTRACT

A video display with integrated control circuitry formed on a single dielectric substrate, includes a dielectric substrate; emitter cathodes formed on the dielectric substrate for emitting electrons; a window plate mounted a fixed distance from the substrate to define a vacuum chamber therebetween; phosphors mounted to the window plate which generate light when irradiated with the electrons; and field effect transistors mounted to the substrate which are electrically interconnected to the emitter cathodes for selectively controlling light emissions from the phosphors.

19 Claims, 6 Drawing Sheets

VIDEO DISPLAY WITH INTEGRATED CONTROL CIRCUITRY FORMED ON A DIELECTRIC SUBSTRATE

BACKGROUND OF THE INVENTION

The present invention generally relates to the field of two-dimensional video displays, and more specifically, to a video display with integrated control circuitry formed on a dielectrically insulating substrate such as sapphire.

The display market is dominated by cathode ray tube (CRT) technology. While offering multi-color high resolution images, CRT displays have performance limitations related to difficulty in scaling to large size, inability to operate at low voltages and low power consumption, and constructing ruggedized displays. To circumvent these limitations, flat panel display technologies including liquid crystal, plasma discharge (PD), field emission (FED), electroluminescent (EL) type displays, micromachined digital displays and the like have been investigated.

Liquid crystal displays are used in a wide variety of commercial applications, including portable computers, wristwatches, camcorders, and large screen televisions. Liquid crystal displays are fabricated on transparent glass or quartz substrates do not generally support the manufacture of high quality electronic materials. This is due to the inherent inability to deposit defect-free, single crystal semiconductor layers on glass or quartz arising from the respective lattice incoherence or mismatch, and the difference in the coefficients of thermal expansion. PD and EL displays are beginning to find their way into the marketplace, primarily in portable computers. However, these types of displays also are fabricated on substrates that do not support the manufacture of high quality electronic devices. The operation of all these type of displays are controlled by integrated circuits. However, the integration of such display driving circuitry with the displays has been limited to thin film transistor technology using amorphous (α-Si) or polycrystalline (poly-Si) silicon deposited on the glass or quartz substrate. The intrinsic properties of amorphous and polycrystalline silicon, such as lattice and thermal mismatch between the circuit layers, and the low temperature deposition techniques used to fabricate such circuits result in a silicon layer with poor charge carrier mobility and crystallographic defects which cause electronic performance limitations such as frequency response and refresh rate.

Of particular importance for integrated displays is the desire for higher density circuitry for ultra-high resolution display applications. Existing material quality is insufficient due to leakage paths which occur in small scale, high density circuitry fabricated in α-Si and poly-Si. Furthermore, compatibility with very large scale integration would allow integration of video drivers, digital logic and other computational circuitry on-chip thereby offering greater functionality, higher reliability, and improved performance.

SUMMARY OF THE INVENTION

The present invention provides a video display with integrated control circuitry formed on a single dielectric substrate and includes: a dielectric substrate; emitter cathodes formed on the dielectric substrate for emitting electrons; a window plate mounted a fixed distance from the substrate to define a vacuum chamber therebetween; phosphors mounted to the window plate which generate light when irradiated with the electrons; and field effect transistors mounted to the substrate which are electrically interconnected to the emitter cathodes for selectively controlling light emissions from the phosphors.

The invention may also be characterized as a method for fabricating a video display with integrated control circuitry formed on a single dielectric substrate. The method includes the steps of: affixing a single crystal silicon layer on a dielectric substrate; forming emitter cathodes from the single crystal silicon; fabricating field effect transistors on the substrate; interconnecting the field effect transistors with the emitter cathodes; mounting phosphors to a window plate; mounting the window plate a fixed distance from the substrate so that electrons emitted from the emitter cathodes irradiate the phosphors; and forming a vacuum between the window plate and the substrate.

The invention may be implemented to integrate PD, EL, micro machined digital displays and other display technologies with integrated control circuitry on a single insulating substrate. The insulating substrate allows closer pixel spacing with the accompanying increase in display resolution. The invention may also be implemented wherein the substrate is transparent and also support device quality semiconductor fabrication of high density control circuitry. Such high density circuitry may be integrated onto the substrate to provide on-chip video drivers, analog-to-digital converters, digital logic and the like. Important advantage of integrating control circuitry and a display on a single substrate include: higher reliability due to fewer connections and wire bonds; ultra-high density displays resulting from higher packing densities; greater functionality by allowing small size and the associated system scale advantages; and high speed and low power consumption from use of CMOS technology. Furthermore, integrated logic may allow real-time signal processing or image corrections. The transparent substrate allows for novel device geometries such as transmissive displays with control circuitry in single crystal silicon, which bulk silicon cannot support.

The invention further provides a method for manufacturing high quality, high resolution video displays in which typical "cross-talk" and electrical shorting or leakage effects are eliminated. This is particularly important in particular in FED applications where high voltages (greater than 5 volts) are employed in micron and submicron dimensions. These and other advantages of the invention will become more readily apparent upon review of the following specification, including the claims, and the accompanying drawings.

DESCRIPTION OF THE PREFERRED EMBODIMENT

Figure 1:
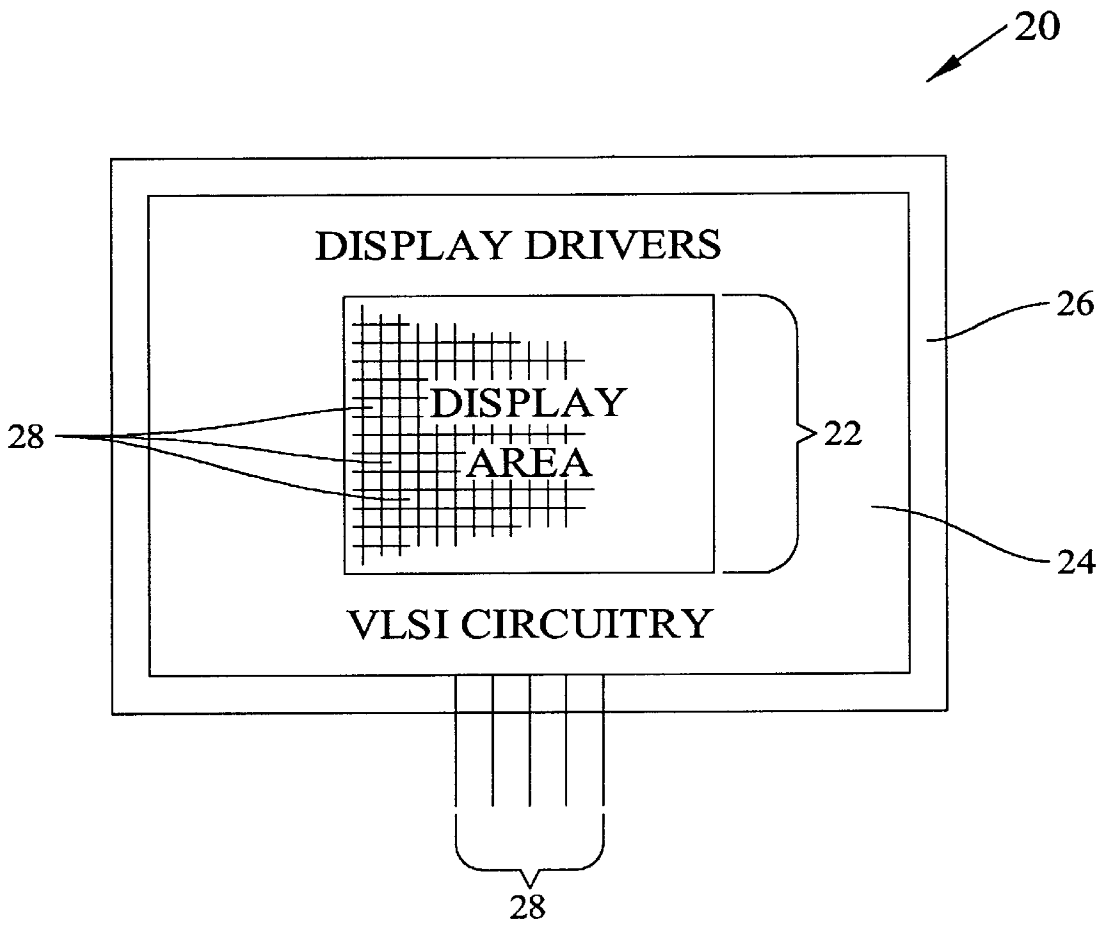
FIG. 1 is a plan view of a video display with integrated control circuitry formed on a dielectric substrate embodying various features of the present invention.

A schematic top view of a ultra-high resolution dielectrically isolated display 20 includes a two dimensional light emitting display area 22 and very large scale integrated (VLSI) circuitry 24 formed on an insulating substrate 26 for controlling individual light emitting pixel elements 28 which comprise the display area 22. The substrate 26 is preferably made of a material upon which single crystal silicon may be fabricated, such as sapphire, quartz, or diamond, although sapphire is presently preferred. Control leads 28 electrically interconnect the VLSI circuitry 24 to an external control device, such as a computer, not shown. VLSI circuitry 24 may be ordinarily implemented as a semiconducting circuit which includes semiconducting elements such as field effect transistors, bipolar transistors, and diodes. Fabrication of the display 20 is described with reference to FIGS. 2–12. A cross-section of a small portion of a completed display 20, shown in FIG. 12, includes electron field emitter cathodes 30, field effect transistor (FET) 32 formed on single insulating (dielectric) substrate 26, and a light emitting (optical) window plate 38 on which one or more phosphors 36 are mounted. The window plate 34 and phosphors 36 collectively comprise window plate assembly 34. The emitter cathodes 30 are structures which emit electrons. Phosphors 36 are structures which emit optical energy when stimulated by electrons generated by the emitter cathodes 30. The window plate 38 is mounted a fixed distance d above the substrate 26 so as to provide a vacuum cavity 40 in the space between the window plate 38 and the substrate 26 in accordance with the teachings of copending and commonly assigned application Ser. No. 08/668,646, filed Jun. 13, 1996, incorporated herein by reference. The phosphors 36 emit light 37 when stimulated by electrons 39 emitted from the emitter cathodes 30 which propagate through vacuum cavity 40 formed between the window plate 38 and substrate 26. The emitter cathodes 30 are controlled by one or more FETs 32 (although only one FET 32 is shown to facilitate illustration of the invention) formed on the substrate 26 which comprise VLSI circuit 24.

Figure 2:
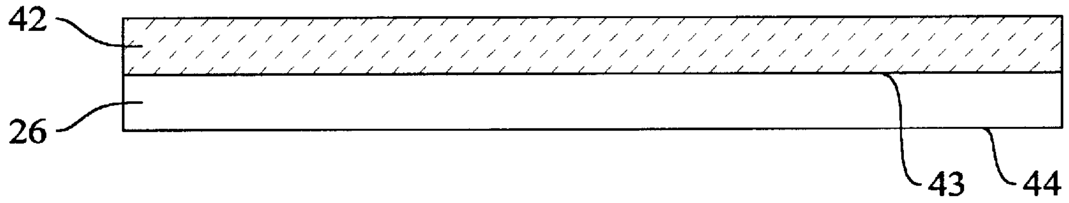
FIGS. 2–12 illustrate various steps in the manufacture of the video display of FIG. 1.
Figure 3:
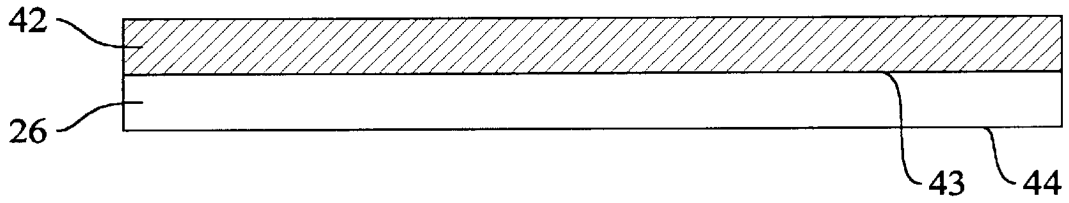

Fabrication of display 20 is described with reference to FIG. 2 in which an unimproved silicon layer 42 preferably is epitaxially grown on the generally planar frontside 43 of a dielectric substrate 26 such as sapphire ($Al_2O_3$). The silicon layer 42 may have a thickness in the range of about 100 to 1000 nm. The substrate 26 further has a generally planar backside 44 opposed to frontside surface 43. Several techniques may be employed to form the unimproved epitaxial silicon layer 42, including chemical vapor deposition (CVD), molecular beam epitaxy, ultra-high vacuum CVD, laser-assisted CVD and rapid thermal CVD. The CVD techniques typically employ the thermal decomposition of silane and subsequent nucleation and growth of silicon on the heated substrate 26. Upon cooling, twinning defects are typically formed in the unimproved silicon layer 42 due to the difference in the coefficients of thermal expansion between the silicon layer 42 and substrate 26. Twinning defects, which are incoherent alignments of atoms within the crystal, may be substantially eliminated by ion implanting the silicon layer 42 at $8.0\times10^{14}$ $cm^{-2}$ and 185 keV, which amorphizes the silicon thereby eliminating the defects. Subsequent furnace annealing at about 900° C. of the amorphized implanted silicon layer, forms single crystal silicon 42 without the twinning defects which provides improved electrical charge mobility that directly increases the high speed and performance of VLSI circuitry 24. Alternatively, improved silicon layer 42 may also be formed using well known bond and etch-back techniques, or by lift-off and bonding techniques. In some applications of the invention, deposition of silicon on the high quality silicon layer 42 may be desired to increase the total thickness of the layer 42 to about 300 to 10000 nm to facilitate fabrication of the emitter cathodes 30 and associated electronic circuitry. However, in some applications, it may be necessary to thin the silicon layer 42 which may be accomplished using thermal oxidation techniques which consume silicon, or by performing an oxide etch.

Figure 4:
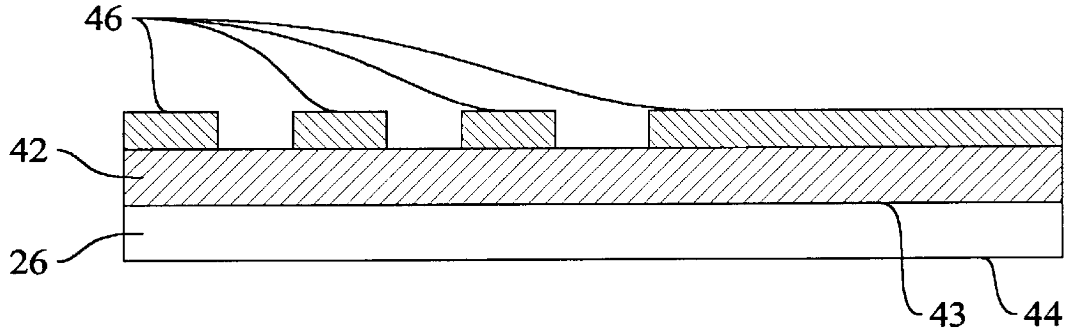
Figure 5:
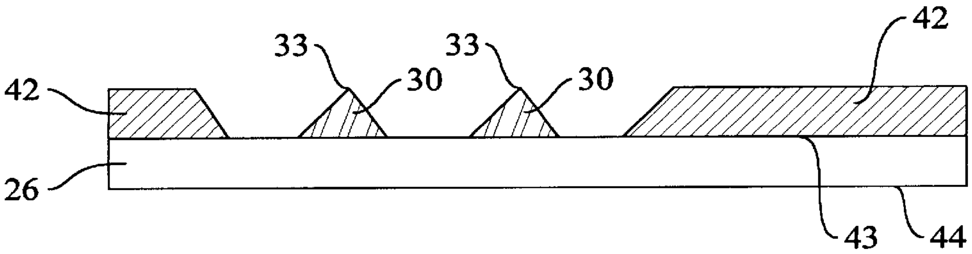
Figure 6:
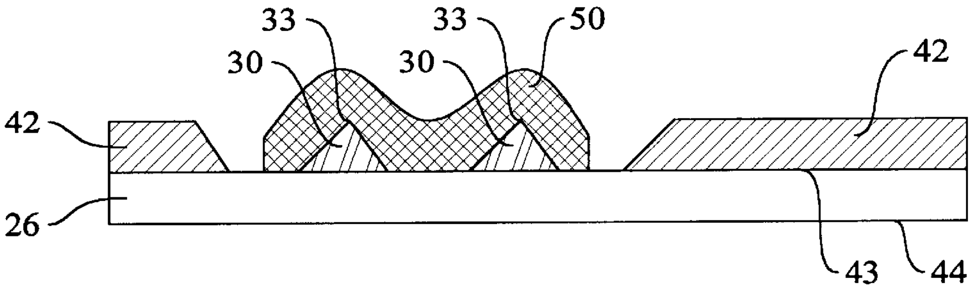

FIG. 4 illustrates the formation and selective etch of a masking layer 46 of, for example, $SiO_2$ or $Si_3N_4$, to delineate locations for the emitter cathodes 30 (shown in FIG. 12) and, therefore, establish pixel locations of display 20. Next, the masking layer 46 may be anisotropically etched using KOH to form the emitter cathodes 30 from the improved silicon layer 42, as shown in FIG. 5. The emitter cathodes 30 preferably have triangular cross-sectional areas so that their tips 33 concentrate applied electric fields to facilitate electron emission. Referring to FIG. 6, the emitter cathodes 30 are passivated with a silicon nitride ($Si_3N_4$) layer 50 formed over the emitter cathodes 30.

Figure 7:
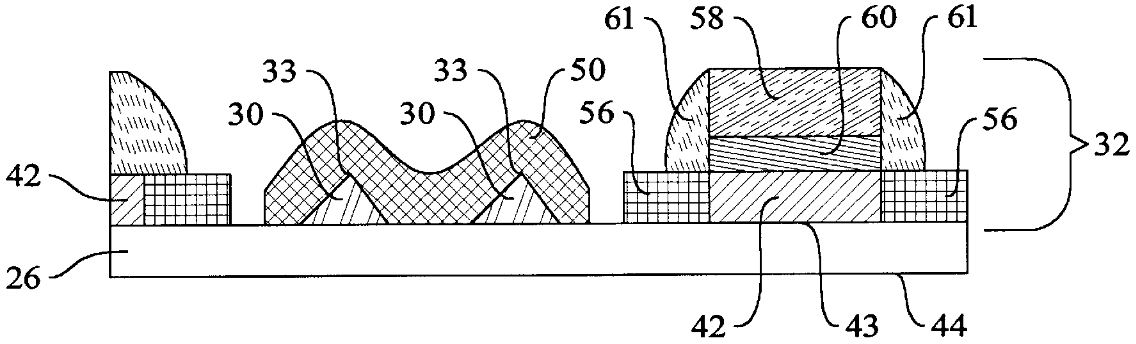
Figure 8:
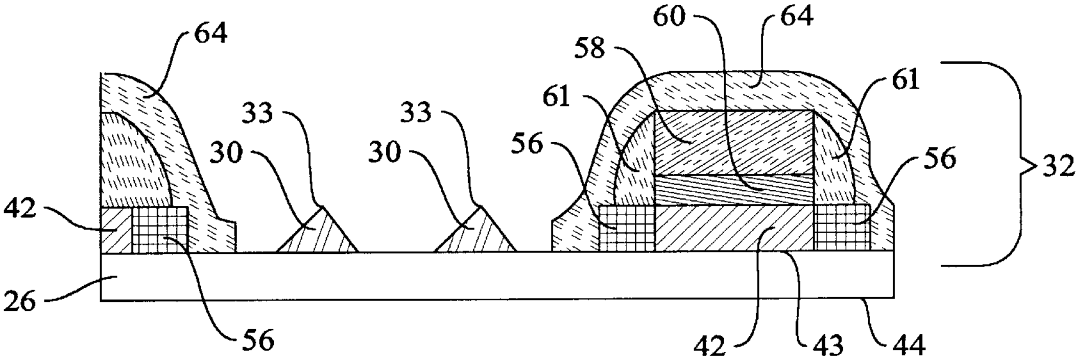

FIG. 7 shows a field effect transistor (FET) 32 formed on the substrate 26, as for example by conventional CMOS/SOS transistor fabrication techniques. FET 32 includes source/drains 56, polysilicon gate 58, insulating oxide layer 60, improved silicon layer 42, and two silicon dioxide ($SiO_2$) sidewall spacers 61. The sidewall spacers 61 provide an insulating barrier between the source/drains 56 and the gate 58. Next, as shown in FIG. 8, FET 32 and any other circuitry fabricated on substrate 26 is passivated with a patterned $SiO_2$ layer 64 which provides mask protection for such circuitry from subsequent processing. During the formation of field effect transistor (FET) 32, spacer structures may be simultaneously fabricated in accordance with the teachings of co-pending and commonly assigned application Ser. No. 08/668,646, filed Jun. 13, 1996, to facilitate the fabrication of the vacuum cavity 40 in the space between the window plate 34 and the substrate 26.

Figure 9:
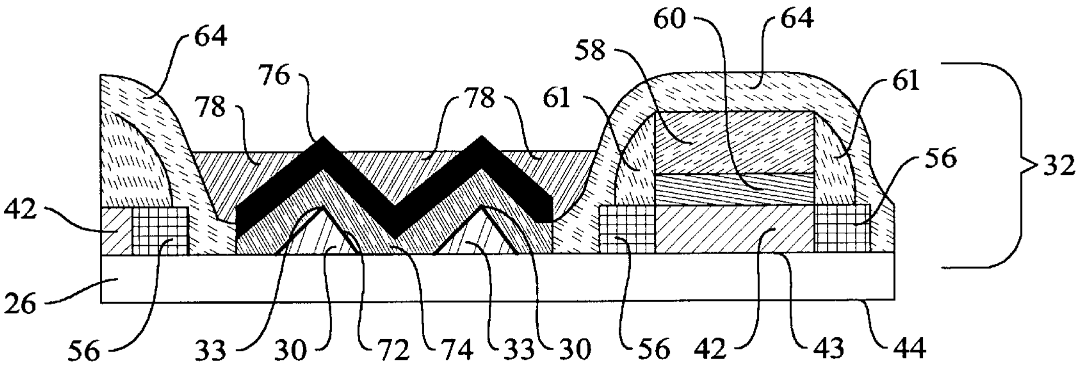
Figure 10:
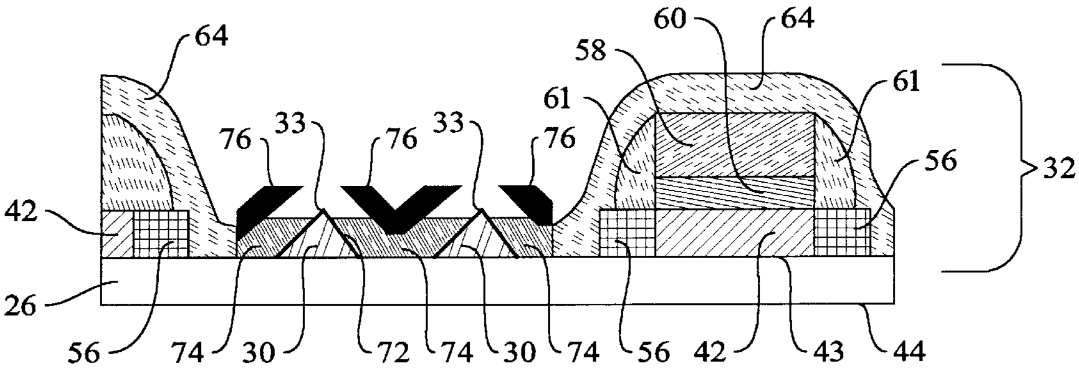

Referring to FIG. 9, a nitride passivation layer (not shown) is formed over the structures fabricated on substrate 26 and selectively etched, using for example, hot phosphoric acid, so that the emitter cathodes 30 may be subjected to further processing without causing detrimental effects on adjacent CMOS circuitry, including FET(s) 32. Next, a layer 72 of metal, such as Mo, Au, or Ag, may be formed on emitter cathodes 30 to reduce their work function to increase the electron emission efficiency of the cathodes 30. Then an insulating oxide layer 74 is formed over the emitter cathodes 30. A grid metal layer 76 and then a resist layer 78 are formed over the oxide layer 74. The insulating layer 74 electrically isolates the metal layer 72 from the metal layer 76. Next, as shown in FIG. 10, the resist layer 78 is selectively etched to expose portions of the metal layer 72 covering the tips 33 of emitter cathodes 30.

Figure 11:
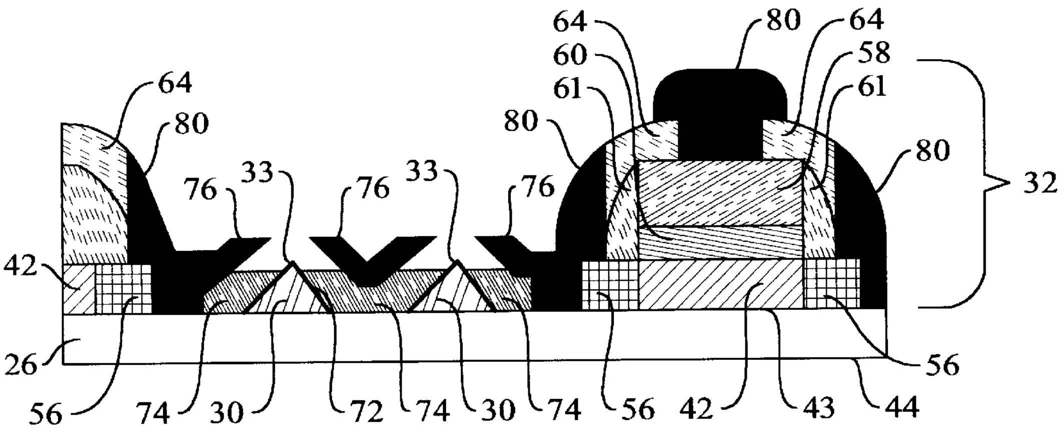
Figure 12:
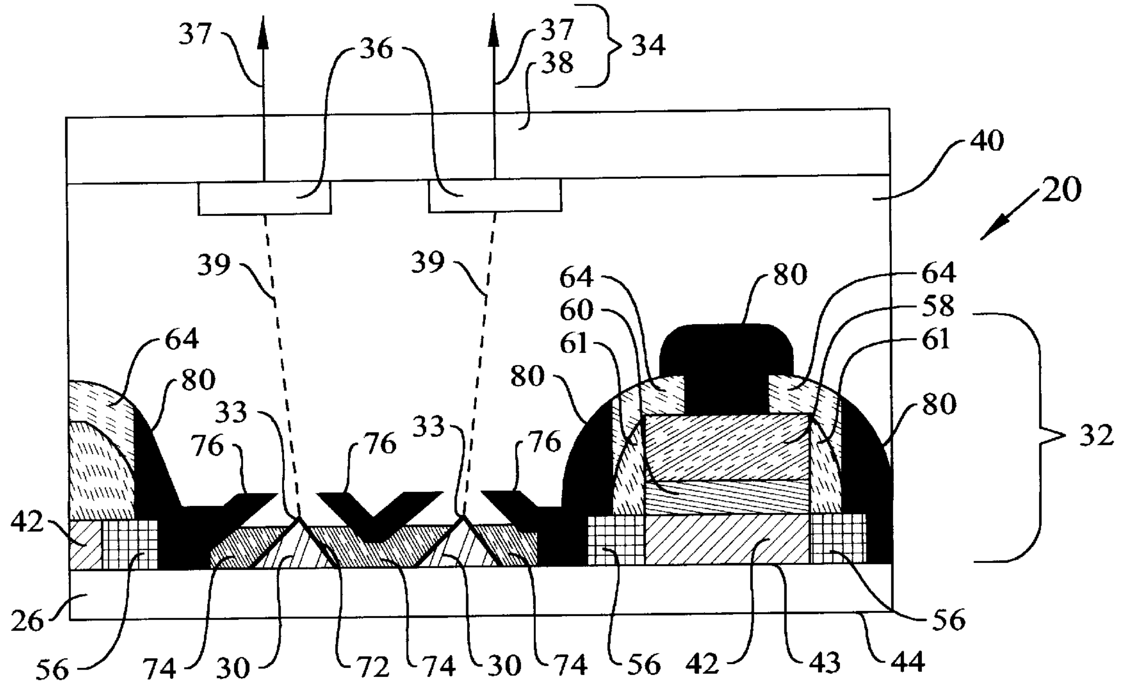
Figure 13:
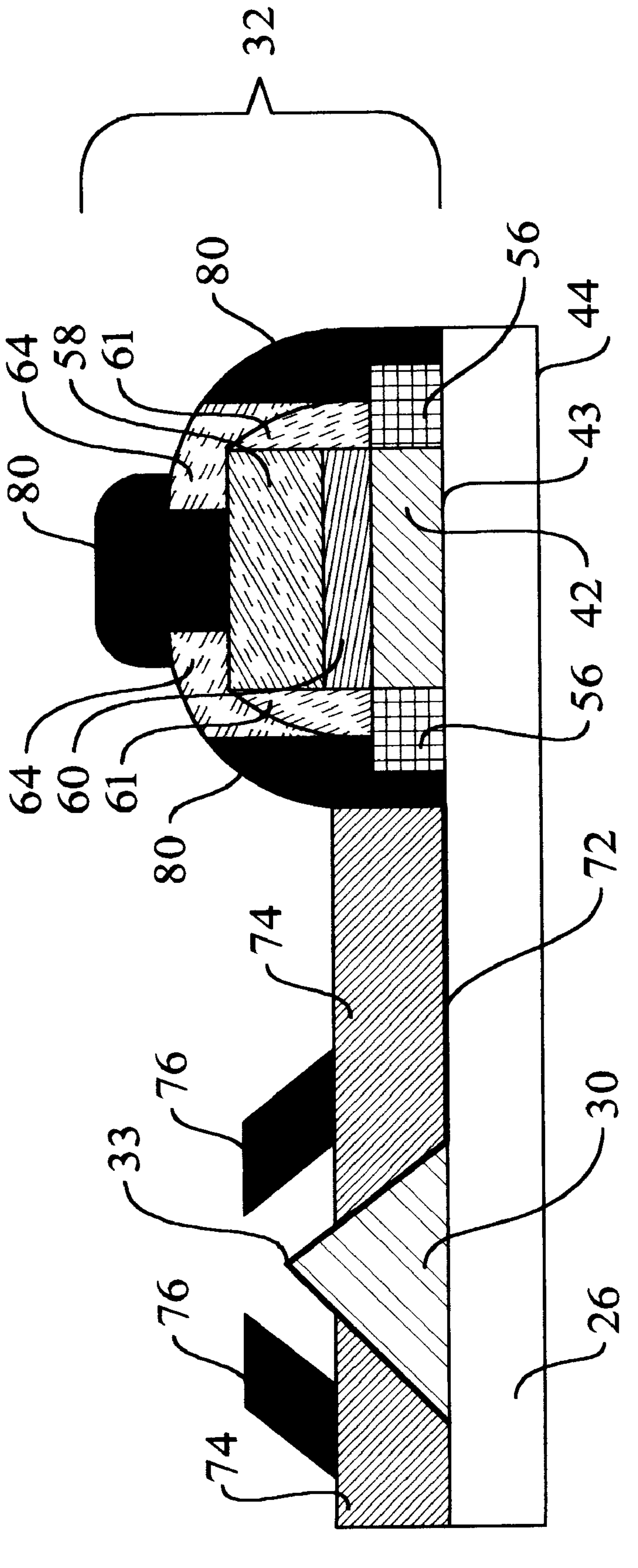
FIG. 13 is a cross-sectional view of the video display of FIG. 1 which shows a metal layer that interconnects the electron field emitter cathode with the field effect transistor.

FIG. 11 shows the fabrication of interconnect metallization layer 80 through contact holes (not shown) formed in silicon dioxide layer 64 which connect to the polysilicon gate 58 of FET 32. Finally, as shown in FIG. 12, phosphor anodes 36 are mounted to transparent window 38 which is mounted a fixed distance d from substrate 26 in accordance with techniques well known in the art of semiconducting device fabrication. In the above fabrication steps, appropriate lithographic patterning may be employed to provide the required interconnections and circuit configurations and architectures. The net effect is the monolithic integration of the display technology with its associated drive circuitry which includes image processing and/or amplifying circuitry required to suit the needs of a particular application.

Obviously, many modifications and variations of the present invention are possible in light of the above teachings. For example, flat panel displays such as liquid crystal displays, plasma discharge displays, field emission displays, electroluminescent displays, and micro machined digital displays, and integrated circuitry may be constructed on a single insulating substrate. Therefore, it is to be understood that within the scope of the appended claims, the invention may be practiced otherwise than as specifically described.

It is claimed:

1. A video display with integrated control circuitry, comprising:

a dielectric crystal substrate;

an emitter cathode mounted directly on said dielectric crystal substrate for emitting electrons;

an optical window mounted a fixed distance from said dielectric crystal substrate;

a light emitting structure mounted to said optical window which generates light when irradiated with said electrons; and a semiconducting circuit mounted to said dielectric crystal substrate which is electrically interconnected to said emitter cathode.

2. The video display of claim 1 wherein said dielectric crystal substrate is a material consisting essentially of the group that includes sapphire, quartz, and diamond.

3. The video display of claim 1 further including a vacuum chamber formed between said optical window and said dielectric crystal substrate.

4. The video display of claim 3 wherein said emitter cathode has a single crystal silicon structure.

5. The video display of claim 4 wherein said emitter cathode has a generally triangular cross-section.

6. The video display of claim 4 further including a layer of metal formed on said emitter cathode.

7. The video display of claim 6 wherein said metal layer consists essentially of a material selected from the group that includes molybdenum, gold, and silver.

8. The video display of claim 1 wherein said light emitting structure includes phosphors.

9. The video display of claim 1 wherein said semiconducting circuit includes a transistor.

10. The video display of claim 9 wherein said transistor is a field effect transistor.

11. The video display of claim 9 wherein said transistor is a bipolar transistor.

12. The video display of claim 1 wherein said semiconducting circuit includes a diode.

13. A method for fabricating a video display with integrated control circuitry comprising the steps of:

affixing a single crystal silicon layer directly on a dielectric crystal substrate;

forming emitter cathodes for emitting electrons from said single crystal silicon layer;

fabricating a semiconducting circuit on said dielectric crystal substrate;

interconnecting said semiconducting circuit with said emitter cathodes;

mounting an optical window plate a fixed distance from said dielectric crystal substrate; and mounting light emitting structures on said optical window plate for emitting light when irradiated with said electrons emitted from said emitter cathodes.

14. The method of claim 13 wherein said dielectric crystal substrate consists essentially of a material selected from the group that includes sapphire, quartz, and diamond.

15. The method of claim 13 further including forming a vacuum chamber between said optical window plate and said dielectric crystal substrate.

16. The method of claim 13 wherein said light emitting structures include phosphors.

17. The method of claim 13 wherein said emitter cathodes each have a generally triangular cross-section.

18. The method of claim 13 further including the step of forming a layer of metal on each of said emitter cathodes.

19. The method of claim 18 wherein said metal consists essentially of a material selected from the group that includes molybdenum, gold, and silver.

* * * * *